Jan. 5, 1960 A. B. PRZEDPELSKI 2,920,190

RADIO RECEIVER HAVING MEANS TO WOBBLE LOCAL OSCILLATOR DURING TUNING

Filed Oct. 17, 1955

INVENTOR.
Andrzej B. Przedpelski
BY
Marshall A. Burmeister
Attorney

United States Patent Office 2,920,190

Patented Jan. 5, 1960

2,920,190

RADIO RECEIVER HAVING MEANS TO WOBBLE LOCAL OSCILLATOR DURING TUNING

Andrzej B. Przedpelski, Forest Park, Ill., assignor to A. R. F. Products, Inc., River Forest, Ill., a corporation of Illinois Application October 17, 1955, Serial No. 540,963

7 Claims. (Cl. 250—20)

The present invention relates to devices for receiving radio frequency signals, and in particular to devices for increasing the audibility of the electrical signals detected by a radio receiver.

The most commonly used receiving device for R.F. signals at the present time is the superheterodyne receiver. In a superheterodyne receiver, the incoming R.F. signal is beat with a signal from an oscillator in the receiver to produce an intermediate frequency signal of predetermined frequency, and the intermediate frequency signal is conducted through a fixed frequency amplifier, or I.F. amplifier, to a detector. It is common in such receivers to couple a second oscillator, called a beat frequency oscillator, to the output of the I.F. amplifier and to tune this oscillator to the center frequency of the I.F. amplifier. In this manner, beats of audible frequency are produced by mixing of the signal from the beat frequency oscillator and the signal from the I.F. amplifier when the two signals differ in frequency by an audible amount, and the sensitivity of the receiver is increased as a result of the increased audibility of the signal being received. Beat frequency oscillators are particularly useful for locating signals of unknown frequency, since as the receiver is tuned toward the signal, the pitch of the audible difference signal falls and vanishes when the frequency of the signal from the I.F. amplifier is the same as the frequency of the beat frequency oscillator.

This system of increasing the sensitivity of a receiver is less satisfactory at higher frequencies than it is at lower frequencies. The success of a beat frequency oscillator depends on the frequency difference between the beat frequency oscillator and the signal from the I.F. amplifier remaining constant. As the frequency of operation increases, the frequency stability of oscillators declines. Further, the stability of the audio signal is more difficult to maintain, since the stability of the oscillator, the beat frequency oscillator, and the received signal all determine the stability of the audio signal produced.

It is one of the objects of the present invention to provide a device for receiving electrical signals which includes means for producing an audible tone in which the frequency of the tone is independent of the frequency of operation of the receiver.

One method of providing an R.F. signal with an audible tone in which the tone produced is independent of the frequency of the R.F. signal is to modulate the R.F. signal with a signal of audio frequency. If an audio oscillator is coupled to the I.F. amplifier and made to vary the transconductance of one of the vacuum tubes of the I.F. amplifier, a tone of audible frequency will be produced by any signal passing through the I.F. amplifier. Such a device has the disadvantage, however, that the tone produced is of constant pitch, and merely varies in amplitude with the amplitude of the signal being received. The human ear is much more sensitive to changes in pitch than it is to changes in amplitude, and hence the sensitivity increase of a receiver resulting from the incorporation of constant pitch tone modulation is not as great as it is in the case of incorporating a beat frequency oscillator in a receiver. It is therefore an object of the present invention to provide a receiver with a tone modulation system which is independent of the frequency of the received R.F. signal and which produces a pitch varying with the amplitude of the received signal.

These and other objects of the present invention will be readily apparent from a further reading of this disclosure, particularly when viewed in the light of the drawings, in which.

Figures 1, 2, 3:
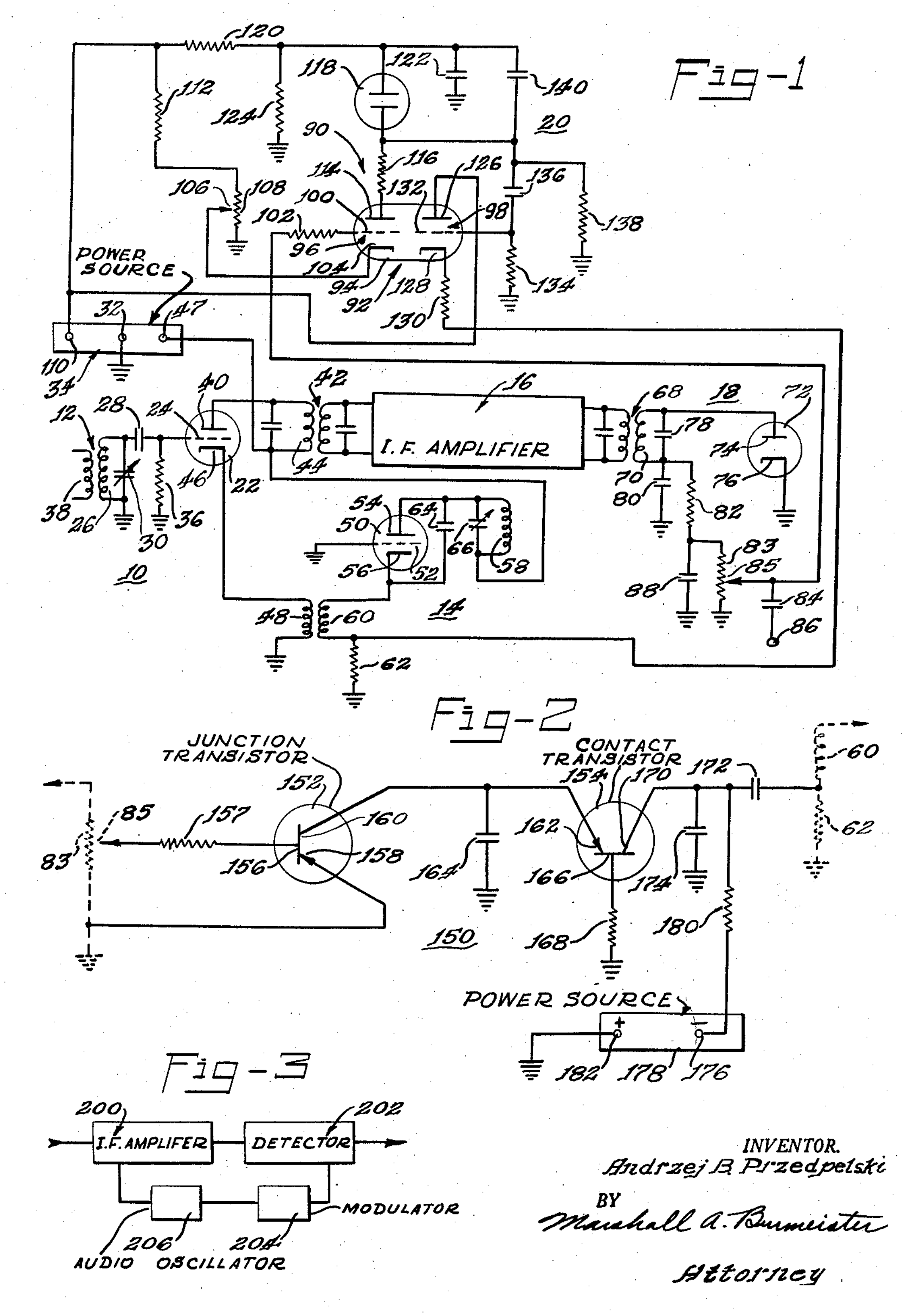
Figure 1 is a schematic electrical circuit diagram of a receiving device for R.F. signals incorporating a tone modulator according to the teachings of the present invention.
Figure 2 is a schematic electrical circuit diagram of another embodiment of a tone modulator for practicing the present invention.
Figure 3 is a schematic view of another embodiment of the present invention.

Figure 1 illustrates a superheterodyne receiver constructed according to the present invention. This receiver has a mixer 10 with an input circuit 12 adapted to be connected to the source of the R.F. signal to be received and detected. The mixer 10 is also electrically connected to an oscillator 14, and to the input of an I.F. amplifier 16. The output of the I.F. amplifier 16 is connected to a demodulator or detector 18 which develops and audio signal from the incoming R.F. signal. A tone modulation circuit 20, which will be later described in detail, is connected between the detector 18 and the oscillator 14.

The mixer 10 employs a vacuum tube 22 with a grid 24 connected to the input circuit 12, the grid 24 being connected to a coil 26 through a coupling capacitor 28. A variable capacitor 30 is connected in parallel with the coil 26 to permit the frequency of the input circuit to be varied to that of the signal being received. The ends of the coil 26 and capacitor 30 remote from the grid 24 are connected to the negative terminal 32 of a power source 34, this terminal 32 forming a common ground for the receiver. The grid 24 of vacuum tube 22 is also connected to ground through a grid resistor 36. A second coil 38 is mutually coupled with the coil 26 and is adapted to be connected to the R.F. source of signals to be received and detected, such as an antenna, usually through an R.F. amplifier with one or more stages of amplification.

Vacuum tube 22 also has a plate 40 which is coupled to the I.F. amplifier 16 by an I.F. transformer 42 with a primary winding 44 connected between the plate 40 and a positive terminal 47 of the power source 34. The current return electrode of vacuum tube 22 is a cathode 46 which is connected to ground through a coil 48 which couples the oscillator 14 to the mixer 10.

The oscillator 14 is of the grounded grid type, and has a vacuum tube 50 with a grid 52 connected to ground. Vacuum tube 50 also has a plate 54 and cathode 56, the plate 54 being connected to the positive terminal 47 of the power source 34 through a coil 58, and the cathode 56 being connected to ground through a coil 60 which is mutually coupled with the coil 48 in the cathode circuit of the mixer 10, and a resistor 62. A feedback capacitor 64 is connected between the plate 54 and cathode 56 of the vacuum tube 50, and a variable tuning capacitor 66 is connected in parallel with the coil 58.

The detector 18 is coupled to the output of the I.F. amplifier 16 by an I.F. transformer 68 with a secondary winding 70. The detector 18 has a diode vacuum tube 72 with a plate 74 connected to one end of the secondary winding 70, and a cathode 76 connected directly to ground. A capacitor 78 is connected in parallel with the secondary winding 70, and a capacitor 80 is connected from the end of the winding 70 remote from the plate 74 to ground.

Resistor 82 and variable resistor 83 are connected in series between the junction of winding 70 and capacitor 80 and ground, and a capacitor 84 is connected between the tap 85 on variable resistor 83 and an audio output terminal 86. A by-pass capacitor 88 is connected in parallel with variable resistor 83.

The modulator 20 consists of two stages, a relaxation oscillator 90 and a cathode follower 92, both employing electron valves in the form of vacuum tubes. A single vacuum tube 94 with two sections 96 and 98 is used in the modulator 20, the section 96 being connected in the relaxation oscillator circuit and the section 98 being connected in the cathode follower circuit. Vacuum tube section 96 has a control grid 100 which is connected to the tap 85 of resistor 83 of the detector 18 through a resistor 102, thus impressing the audio signal from the detector 18 upon the tube section 96. The tube section 96 also has a cathode 104 which is connected to a tap 106 of a potentiometer 108, the potentiometer 108 being connected to ground at one end and to a positive terminal 110 of the power source 34 at the other end through a resistor 112, thus establishing the bias conditions for vacuum tube section 96.

Vacuum tube section 96 also has a plate 114 which is connected to the positive terminal 110 of the power source 34 through a resistor 116, neon tube 118, and resistor 120 serially connected in that order. A capacitor 122 and resistor 124 are connected between the junction of the neon tube 118 and resistor 120 and ground.

Vacuum tube section 98 has a plate 126 connected to the positive terminal 110 of the power source 34, and a cathode 128 connected to the junction of resistor 62 and coil 60 in the oscillator circuit 14 through a resistor 130. Vacuum tube section 98 also has a grid 132 connected to ground through a resistor 134 and to the junction of the neon tube 118 and the resistor 116 through a capacitor 136. This junction is also connected to ground through a resistor 138, and to the junction of the neon tube 118 and resistor 120 through a capacitor 140.

In one particular construction of the present invention, vacuum tube 94 is a type 12AT7, and the neon tube 118 is a type NE–2. The power source 34 delivers a potential of 250 volts between the grounded terminal 32 and terminal 46, and a potential of 140 volts between terminals 32 and 110. The values of some of the resistors and capacitors which determine operating conditions are as follows:

| | | |
|---|---|---|
| Resistor 62 | ohms | 470 |
| Resistor 112 | do | 470,000 |
| Potentiometer 108 | do | 5,000 |
| Resistor 102 | do | 220,000 |
| Resistor 120 | do | 33,200 |
| Resistor 124 | do | 100,000 |
| Resistor 116 | megohms | 1.0 |
| Capacitor 122 | mfd | 0.1 |
| Capacitor 140 | mmfd | 1,100 |
| Resistor 130 | ohms | 1,500 |
| Resistor 134 | megohms | 1.5 |
| Resistor 138 | do | 15 |
| Capacitor 136 | mfd | 0.01 |

Any R.F. signal impressed on coil 38 of the input circuit 12 is mixed with the signal from the oscillator 14 to produce a difference signal within the band width of the I.F. amplifier 16. The output of the I.F. amplifier 16 is rectified by the detector 18 and appears as an audio signal across capacitor 80, as is conventional.

The relaxation oscillator 90 of the modulator 20 charges capacitor 140 through vacuum tube section 96. When the charge on capacitor 140 develops a potential which exceeds the flashing point of the tube 118, the neon tube 118 conducts, thus discharging capacitor 140 and impressing a positive pulse on grid 132 of vacuum tube section 98. As a result of the cathode follower action of stage 92, a positive pulse appears across resistor 62 of the oscillator 14, and the oscillator 14 is cathode modulated by this pulse. The modulation level is maintained near the 100% level principally by selecting suitable values for resistor 134 and condenser 136. It is of course to be understood that plate, suppressor grid, or grid modulation of the oscillator 14 could be employed, but cathode modulation has been employed because a relatively small amount of excitation can be employed to produce 100% modulation without reducing the output of the oscillator 14 to too great an extent.

The charging circuit of the relaxation oscillator 90 includes vacuum tube section 96, and hence the frequency of the oscillator 90 is variable by varying the bias applied to grid 100 of vacuum tube section 96. For this reason, the output of the detector 18 is coupled to the grid 100 of vacuum tube section 96, and an increase in the output of the detector 18 results in a decrease in the charging rate of capacitor 140 of the modulator 20, and hence a lowering of the frequency of the modulation applied to the oscillator 14.

When an unmodulated R.F. signal is coupled to the input circuit 12 of the mixer 10, the amplitude of the output of the I.F. amplifier is partially determined by the frequency of the oscillator 14, in that the difference between the frequency of the incoming signal and the oscillator frequency must approximate the I.F. frequency to pass to the detector 18. This is due to the fact that signals having a frequency near the center of the band pass of the I.F. amplifier are amplified to a greater extent than those near the sides of the band pass. As a result, the frequency of the detected signal falls as this difference frequency approaches the I.F. frequency and rises as it departs from the I.F. frequency, much in the same manner as in a receiver with a beat frequency oscillator, but without the necessity for stabilizing the frequency of a second oscillator. The tap 106 of the variable resistor 108 may be adjusted to produce the desired tone which modulates the intermediate frequency signal.

Figure 2 illustrates a modulator 150 which is used to replace the modulator 20 in the circuit of Figure 1. The modulator 150 utilizes two electron valves in the form of transistors 152 and 154, and it is to be understood that the modulator 150 is applicable for use with a mixer, I.F. amplifier, oscillator, and detector which also employ transistors, rather than the vacuum tube circuits shown in Figure 1.

Transistor 152 is a junction type transistor, in the particular construction described herein a type 2N36, and has a base 156 which is connected to the tap 85 of resistor 83 of the detector 18 through a resistor 157, as indicated in Figure 2. The transistor 152 also has an emitter 158 directly connected to the negative terminal 32 of the power source 34, or ground, and a collector 160 which is connected to an emitter 162 of transistor 154. A capacitor 164 is connected between the collector 160 and ground.

Transistor 154 is a contact type transistor, in this construction a 1768, and has a base 166 connected to ground through a resistor 168, and a collector 170 connected to the junction of the coil 60 and resistor 62 of the oscillator 14 through a capacitor 172. The collector 170 is also connected to ground through a capacitor 174, and to the negative terminal 176 of a power source 178 through a resistor 180. The power source 178 has a positive terminal 182 which is connected to ground, and thus to the negative terminal 32 of power source 34.

The potential supplied by the power source 178 is 150 volts, and the values of the resistors and capacitors used in the construction here described are as follows:

| | | |
|---|---|---|
| Resistor 157 | ohms | 100,000 |
| Capacitor 164 | mfd | 0.47 |
| Resistor 168 | ohms | 12,000 |
| Capacitor 174 | mfd | 0.01 |
| Resistor 180 | ohms | 47,000 |
| Capacitor 172 | mfd | 0.1 |

The transistor 154 is connected in a free running multivibrator circuit. The emitter current of a contact type transistor has a region with a negative resistance characteristic, and when the emitter load resistance is selected to provide a load line intersecting the negative resistance portion of the emitter current-voltage curve, as in this modulator, the circuit will sustain oscillation.

In the modulator 150, the emitter load resistance comprises transistor 152. The circuit of transistor 152 presents an effective resistance to the emitter of transistor 154 depending upon the magnitude of the potential applied to the base of transistor 152. As a result of this potential being determined by the strength of the detected signal, the frequency of the modulator 150 is also determined by the frequency of the detected signal.

Figure 3 shows still another embodiment of the present invention. In this figure, an I.F. amplifier 200 is shown connected to a detector 202, the R.F. signal being impressed on the input of the I.F. amplifier 200. The I.F. amplifier 200 and detector 202 may be identical with the I.F. amplifier 16 and detector 18 illustrated in Figure 1, or any one of the well known circuits for these purposes. The output of the detector 202 is connected to the input of a frequency modulator 204, such as a reactance tube modulator, and the output of the frequency modulator 204 is connected to an audio oscillator 206. The frequency modulator 204 and audio oscillator 206 may also be of conventional construction. The audio oscillator 206 is also coupled to the amplifier 200 to modulate the signal being amplified at an audio rate. The audio oscillator 206 is connected to the amplifier 200 to grid modulate, cathode modulate, or plate modulate the amplified signals, in the conventional manners.

The frequency of the audio oscillator 206 is varied in accordance with the amplitude of the output of the detector 202 by the frequency modulator 204. As a result of the amplitude modulation impressed upon the incoming signal by the audio oscillator, this audio tone appears in the output of the detector 202, and the frequency of the tone is varied in accordance with the amplitude of the detected signal. Here again the operation of the receiver has the advantage of greater sensitivity due to the presence of an audio tone in the output audio which changes pitch as the incoming signal is tuned into the frequency band of the I.F. amplifier.

In this patent, the term electron value is used to mean any device capable of regulating the flow of electrons, and includes vacuum tubes and transistors.

From the foregoing disclosure, the man skilled in the art will readily devise many devices which are modifications or different embodiments of the present invention. It is therefore intended that the scope of the present invention be not limited by the foregoing disclosure, but rather only by the appended claims.

The invention claimed is:

1. A radio receiver comprising a mixer having an input circuit adapted to be electrically coupled to a source of radio frequency signals and an output circuit, an oscillator coupled electrically to the mixer, an intermediate frequency amplifier having an input circuit connected electrically to the output circuit of the mixer and an output circuit, a demodulator having an output circuit and an input circuit electrically connected to the output circuit of the intermediate frequency amplifier, said demodulator having a circuit producing a direct current potential monotonically related to the radio frequency signals received, a modulator having an audio oscillator connected electrically to the oscillator, and means electrically connected to the potential producing circuit of the demodulator and to the modulator to vary the frequency of the audio oscillator responsive to the amplitude of the potential of the demodulator, thereby varying the frequency of the modulation impressed upon the oscillator.

2. A radio receiver comprising the elements of claim 1 wherein the modulator includes a neon tube connected in parallel with a capacitor and a capacitor charging circuit including an electron valve, said valve having a control electrode electrically connected to the output circuit of the demodulator.

3. A radio receiver comprising the elements of claim 1 wherein the modulator includes an electron valve having a negative resistance region between positive resistance regions, a capacitor connected to the electron valve, and a capacitor charging circuit connected to the capacitor including a second electron valve, said second electron valve having a control electrode electrically connected to the output circuit of the detector, whereby the modulation frequency of the signal from the amplifier varies with the amplitude of the signal.

4. A radio receiver comprising an amplifier having an input circuit and an output circuit, a mixer coupled to the input circuit of the amplifier, a detector having an input circuit coupled to the output circuit of the amplifier and an output circuit, an oscillator coupled to the mixer having a vacuum tube with a plate, grid, and return electrode, the plate and return electrode of said oscillator being connected in a series circuit including a resistor, and a modulator including an amplifier and an audio oscillator, said oscillator having a neon tube, a capacitor connected in parallel with the neon tube, a vacuum tube having a plate, grid, and return electrode, a resistor connected between the plate of the vacuum tube and one of the terminals of the neon tube, and a source of power connected between the other terminal of the neon tube and the return electrode of the vacuum tube, the grid of said tube being connected to the output of the detector, said amplifier also having a vacuum tube section including a plate, a grid and return electrode, the grid of said vacuum tube section being coupled to the junction between the neon tube and resistor, and the return electrode being electrically connected to the end of the resistor in the oscillator return electrode circuit adjacent to the return electrode of the oscillator tube.

5. A radio receiver comprising a mixer having an input circuit adapted to be electrically coupled to a source of radio frequency signals and an output circuit, an oscillator coupled electrically to the mixer, an intermediate frequency amplifier having an input circuit connected electrically to the output circuit of the mixer and an output circuit, a detector having an output circuit and an input circuit electrically connected to the output circuit of the intermediate frequency amplifier, and means coupled to the oscillator to modulate the oscillator including an audio oscillator having a contact type transistor, a capacitor connected between the emitter and base of said transistor, a variable resistance element connected between the emitter and base of said transistor having a control electrode electrically connected to the output of the detector, and the effective resistance of said resistance element being responsive to the potential applied to said control electrode.

6. A radio receiver comprising a mixer having an input circuit adapted to be coupled electrically to a source of radio frequency signals and an output circuit, an oscillator coupled electrically to the mixer, an intermediate frequency amplifier having an input circuit connected electrically to the output circuit of the mixer and an output circuit, a detector having an output circuit and an input circuit electrically connected to the output circuit of the intermediate frequency amplifier, and means to modulate the oscillator comprising an audio oscillator including a contact type transistor, an emitter to base circuit including a first capacitor and first resistor connected in series between the emitter and base of said transistor, a source of potential with a positive terminal connected to the junction between the first capacitor and first resistor and a negative terminal, a second resistor connected between the negative terminal and the collector of the contact resistor, a second capacitor connected between the positive terminal of the power source and the collector, means coupling the collector to the oscillator, a junction transistor having a base, collector, and emitter, the emitter of said junction transistor being connected to the positive terminal of the power source, and the collector being connected to the emitter of the contact transistor, and said junction transistor having a base to emitter circuit connected to the output of the detector.

7. A radio receiver comprising a mixer having an input circuit adapted to receive radio frequency signals and an output circuit, means connected to the output circuit of the mixer for producing a direct current potential monotonically related to the amplitude of the radio frequency signals appearing in the output circuit of the mixer, a radio frequency oscillator connected to the input circuit of the mixer, and means connected to the oscillator for modulating the frequency of the oscillator at an audio rate, said means having a control circuit connected to the means for producing a potential and varying the audio modulation frequency monotonically with the amplitude of the potential produced by said potential producing means.

References Cited in the file of this patent

UNITED STATES PATENTS

| | | |
|---|---|---|
| 1,968,750 | Edwards et al. | July 31, 1934 |
| 2,122,562 | Ewald | July 5, 1938 |
| 2,131,109 | Lowell | Sept. 27, 1938 |
| 2,263,986 | Finch | Nov. 25, 1941 |
| 2,361,437 | Trevor | Oct. 31, 1944 |
| 2,663,800 | Herzog | Dec. 22, 1953 |
| 2,705,287 | Lo | Mar. 29, 1955 |

FOREIGN PATENTS

| | | |
|---|---|---|
| 153,690 | Great Britain | Nov. 18, 1920 |

OTHER REFERENCES

RCA Review article, vol. X, pp. 14–16, published March 1949.

UNITED STATES PATENT OFFICE

CERTIFICATE OF CORRECTION

Patent No. 2,920,190 January 5, 1960

Andrzej B. Przedpelski

It is hereby certified that error appears in the printed specification of the above numbered patent requiring correction and that the said Letters Patent should read as corrected below.

Column 6, line 74, for "resistor" read -- transistor --.

Signed and sealed this 21st day of June 1960.

(SEAL)
Attest:

KARL H. AXLINE
Attesting Officer

ROBERT C. WATSON
Commissioner of Patents